US010990473B2

(12) United States Patent
Lee et al.

(10) Patent No.: US 10,990,473 B2
(45) Date of Patent: Apr. 27, 2021

(54) SYSTEMS ON CHIPS, INTEGRATED CIRCUITS, AND OPERATING METHODS OF THE INTEGRATED CIRCUITS

(71) Applicant: Samsung Electronics Co., Ltd., Suwon-si (KR)

(72) Inventors: Suh-ho Lee, Seongnam-si (KR); Myung-chul Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 33 days.

(21) Appl. No.: 16/555,357

(22) Filed: Aug. 29, 2019

(65) Prior Publication Data

US 2020/0218604 A1 Jul. 9, 2020

(30) Foreign Application Priority Data

Jan. 4, 2019 (KR) ........................ 10-2019-0001310

(51) Int. Cl.
*G01R 31/3185* (2006.01)
*G06F 1/3296* (2019.01)
*G01R 31/3183* (2006.01)
*G06F 11/10* (2006.01)
*G06F 1/10* (2006.01)
*G06F 1/28* (2006.01)
(Continued)

(52) U.S. Cl.
CPC ...... *G06F 11/1056* (2013.01); *G01R 31/2851* (2013.01); *G01R 31/3183* (2013.01);
(Continued)

(58) Field of Classification Search
CPC .......... G06F 11/1056; G06F 1/10; G06F 1/28; G06F 1/206; G06F 1/3296; G06F 1/324;
(Continued)

(56) References Cited

U.S. PATENT DOCUMENTS 7,096,146 B2   8/2006 Satsukawa
7,502,274 B2   3/2009 Lee et al.
(Continued)

FOREIGN PATENT DOCUMENTS

JP   H06109804 A   4/1994
JP   2018-017544 A   2/2018

OTHER PUBLICATIONS

Girard et al., Power-Aware Testing and Test Strategies for Low Power Devices, Mar. 2011, Design, Automation and Test in Europe, Grenoble, France. lirmm-00820698, pp. 1-54. (Year: 2011).*
(Continued)

*Primary Examiner* — John J Tabone, Jr.
(74) *Attorney, Agent, or Firm* — Harness, Dickey & Pierce, P.L.C.

(57) ABSTRACT

An integrated circuit includes intellectual property (IP) processing circuitries each including a separate, respective at least one scan chain, and temperature management controller circuitry configured to transmit an input pattern including a plurality of bits to at least one scan chain of a first IP processing circuitry among the IP processing circuitries, detect a temperature of the first IP processing circuitries based on an output pattern received from the at least one scan chain in response to the input pattern being transmitted to the at least one scan chain of the first IP processing circuitry, and control at least one of an operation frequency or an operation voltage of the first IP processing circuitry based on the detected temperature of the first IP processing circuitry.

20 Claims, 11 Drawing Sheets

(51) Int. Cl.
*G06F 1/20* (2006.01)
*G06F 1/3206* (2019.01)
*G01R 31/28* (2006.01)
*G06F 1/324* (2019.01)

(52) U.S. Cl.
CPC ........... *G01R 31/318533* (2013.01); *G01R 31/318575* (2013.01); *G06F 1/10* (2013.01); *G06F 1/206* (2013.01); *G06F 1/28* (2013.01); *G06F 1/324* (2013.01); *G06F 1/3206* (2013.01); *G06F 1/3296* (2013.01)

(58) Field of Classification Search
CPC ............. G06F 1/3206; G01R 31/2851; G01R 31/3183; G01R 31/318533; G01R 31/318575
USPC ............ 714/729, 726, 727, 731; 324/762.01, 324/762.02, 762.03
See application file for complete search history.

(56) References Cited

U.S. PATENT DOCUMENTS

| | | | |
|---|---|---|---|
| 7,853,846 B2 | 12/2010 | Cannon et al. | |
| 8,898,530 B1* | 11/2014 | Douskey | G11C 29/028 714/733 |
| 9,400,308 B2 | 7/2016 | Ibrahimovic et al. | |
| 10,067,189 B1 | 9/2018 | Shivaray et al. | |
| 2003/0158697 A1* | 8/2003 | Gold | G06F 1/206 702/132 |
| 2005/0114061 A1* | 5/2005 | Gauthier | G01K 15/00 702/99 |
| 2006/0049843 A1* | 3/2006 | Jenkins | G01R 31/2877 324/750.03 |
| 2012/0126781 A1* | 5/2012 | Narayanan | G01R 31/3004 324/76.11 |
| 2013/0069688 A1* | 3/2013 | Atwood | H03K 19/096 326/16 |
| 2013/0198873 A1* | 8/2013 | Motika | G01R 31/318328 726/34 |
| 2015/0219718 A1* | 8/2015 | Motika | G01R 31/3177 714/727 |

OTHER PUBLICATIONS

Yi et al., A Scan-Based On-Line Aging Monitoring Scheme, Feb. 2014, Journal of Semiconductor Technology and Science, vol. 14, No. 1, pp. 124-130. (Year: 2014).*

* cited by examiner

FIG. 6A

| Error Ratio (ER) | △Frequency | △ Voltage |
|---|---|---|
| 0<ER≤5% | -10 % | 0 |
| 5%<ER≤10% | - 20% | 0 |
| ⋮ | | |
| 25%< ER ≤30% | -10% | -10% |
| 20%< ER ≤35% | -20% | -10% |
| 25%< ER ≤30% | -30% | -20% |

FIG. 6B

| Error Ratio (ER) | SPD | △Frequency | △Voltage |
|---|---|---|---|
| 0<ER≤5% | SS | -10 % | 0 |
| | NN | -20% | 0 |
| | FF | -20% | -10% |
| 5%<ER≤10% | SS | -20% | 0 |
| | NN | -20% | -10% |
| | FF | -30% | -10% |
| ⋮ | | | |

US 10,990,473 B2

SYSTEMS ON CHIPS, INTEGRATED CIRCUITS, AND OPERATING METHODS OF THE INTEGRATED CIRCUITS

CROSS-REFERENCE TO RELATED APPLICATION

This application claims the benefit of Korean Patent Application No. 10-2019-0001310, filed on Jan. 4, 2019, in the Korean Intellectual Property Office, the disclosure of which is incorporated herein in its entirety by reference.

BACKGROUND

The inventive concepts relate to semiconductor devices, and more particularly, to systems on chips (SoCs) that may perform temperature control based on one or more scan chains, integrated circuits, and operating methods of the integrated circuits.

For high performance of electronic devices, intellectual properties (IPs) provided in SoCs may operate on the basis of high frequencies and high voltages. When the IPs are operated on the basis of high frequencies and high voltages, a large amount of heat may be generated, and accordingly, temperatures of the IPs may be increased. When the temperatures of the IPs exceed a normal operation temperature, malfunction of each of the IPs or the SoC may occur, and the stability of an electronic device may not be secured. In addition, as a surface temperature of the electronic device is increased, a user may feel uncomfortable or may get injured.

SUMMARY

The inventive concepts provide integrated circuits configured to precisely detect temperatures of intellectual properties (IPs) provided in the integrated circuits and adjust the temperatures of the IPs, and methods of detecting and adjusting the temperatures of the IPs.

According to some example embodiments of the inventive concepts, an integrated circuit may include intellectual property (IP) processing circuitries, each IP processing circuitry of the IP processing circuitries including a separate, respective at least one scan chain, and temperature management controller circuitry configured to transmit an input pattern including a plurality of bits to at least one scan chain of a first IP processing circuitry among the IP processing circuitries, detect a temperature of the first IP processing circuitry based on an output pattern received from the at least one scan chain of the first IP processing circuitry in response to the input pattern being transmitted to the at least one scan chain of the first IP processing circuitry, and control at least one of an operation frequency or an operation voltage of the first IP processing circuitry, based on the detected temperature of the first IP processing circuitry.

According to some example embodiments of the inventive concepts, a system on chip may include intellectual property (IP) processing circuitries, each IP processing circuitry of the IP processing circuitries including a separate, respective at least one scan chain, and temperature management controller circuitry configured to perform a scan test based on using at least one scan chain for at least one IP processing circuitry in an idle state among the IP processing circuitries, and control a temperature of the at least one IP processing circuitry based on controlling at least one of an operation frequency or an operation voltage of the at least one IP processing circuitry based on a result of the scan test.

According to some example embodiments of the inventive concepts, an operating method of an integrated circuit including intellectual property (IP) processing circuitries may include performing, by temperature management controller circuitry, a scan test on at least one IP processing circuitry in an idle state among the IP processing circuitries, generating, by the temperature management controller circuitry, a frequency control signal and a voltage control signal to control an operation frequency and an operation voltage of the at least one IP processing circuitry based on a result of the scan test, controlling, by clock signal generator circuitry, a frequency of a clock signal transmitted to the at least one IP processing circuitry based on the frequency control signal, and controlling, by a voltage generator, a voltage level of an operation voltage transmitted to the at least one IP processing circuitry based on the voltage control signal.

BRIEF DESCRIPTION OF THE DRAWINGS

Example embodiments of the inventive concepts will be more clearly understood from the following detailed description taken in conjunction with the accompanying drawings in which:

FIGS. 6A and 6B are diagrams for explaining methods of controlling an operation voltage and an operation frequency, according to some example embodiments;

DETAILED DESCRIPTION OF THE EMBODIMENTS

Hereinafter, some example embodiments of the inventive concepts are described with reference to the accompanying drawings.

Figure 1:
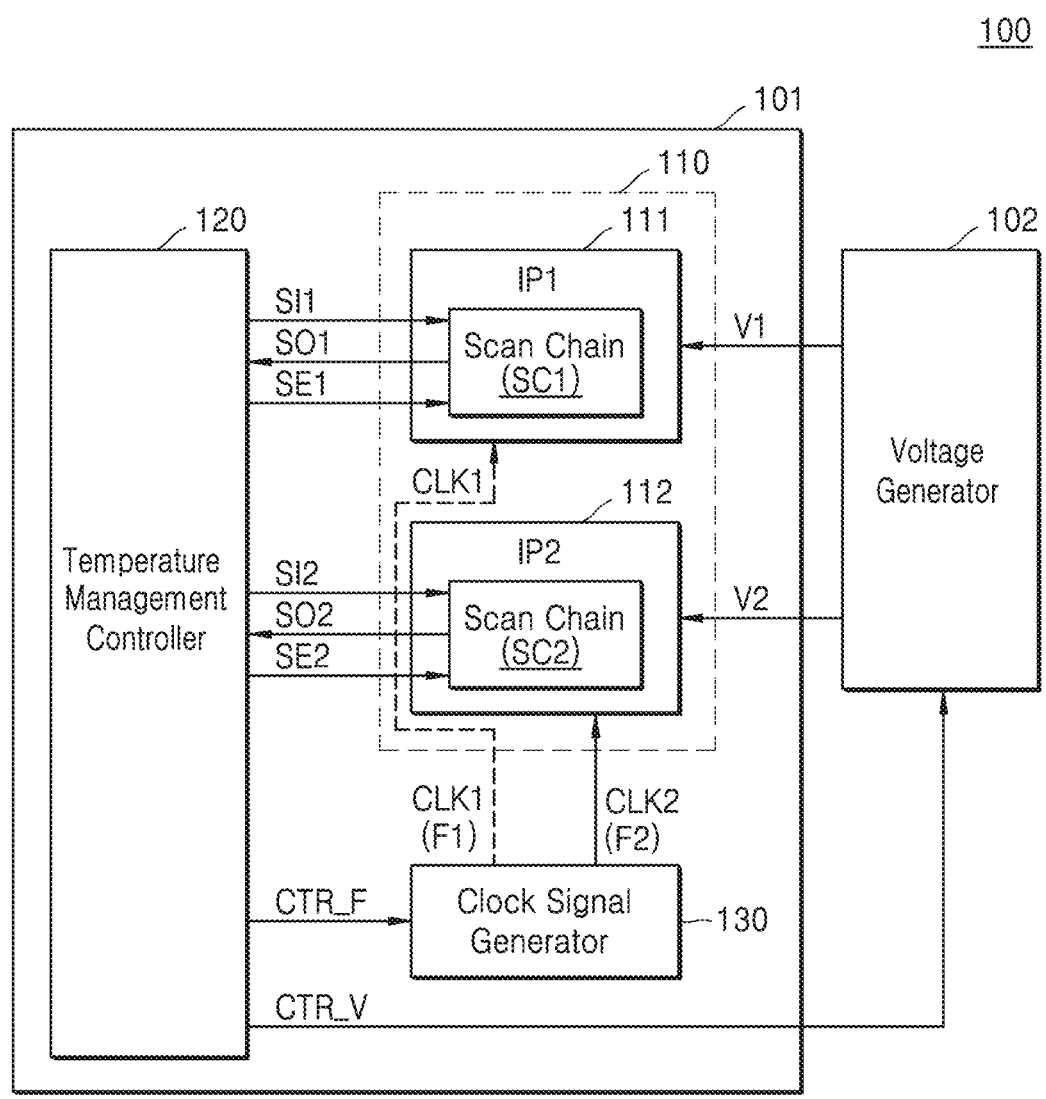
FIG. 1 is a schematic block diagram illustrating an electronic system including an integrated circuit, according to some example embodiments.
Figure 2:
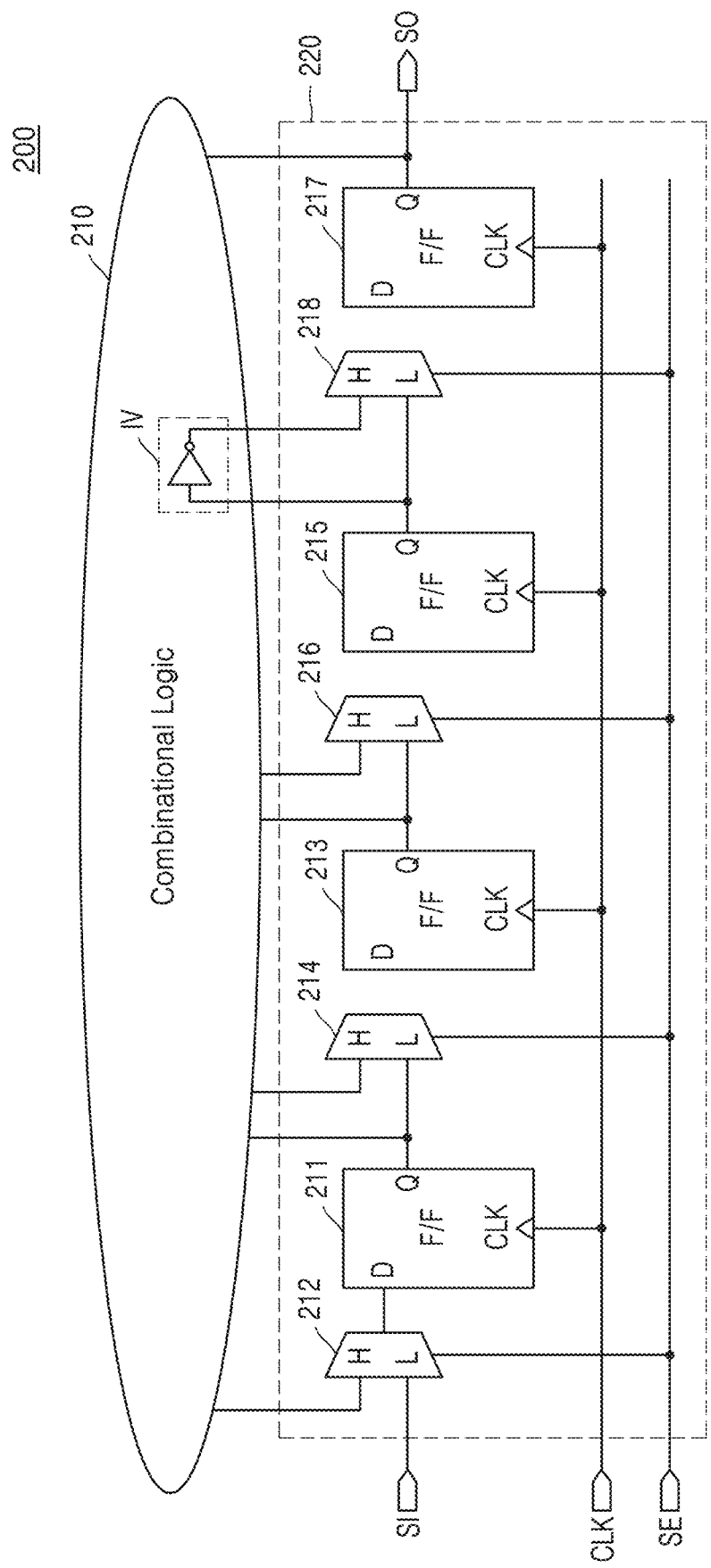
FIG. 2 is a diagram illustrating an intellectual property (IP) including a scan chain according to some example embodiments.

FIG. 1 is a schematic block diagram illustrating an electronic system 100 including an integrated circuit 101, according to some example embodiments, and FIG. 2 is a diagram illustrating an intellectual property (IP) including a scan chain according to some example embodiments.

The electronic system 100 may be mounted on (e.g., included in) an electronic device, including a laptop computer, a smart phone, a tablet personal computer (PC), a personal digital assistant (PDA), an enterprise digital assistant (EDA), a digital camera, a portable multimedia player (PMP), a portable navigation device (PND), a handheld game console, a mobile internet device (MID), a multimedia device, a wearable computer, an internet of things (IoT) device, an internet of everything (IoE) device, an e-book, a drone, an advanced drivers assistance system (ADAS), an augmented reality (AR), etc., and may also be mounted on an electronic device that performs high-speed communication.

Referring to FIG. 1, the electronic system 100 may include an integrated circuit 101 and a voltage generator 102. The integrated circuit 101 (also referred to herein as "integrated circuitry") may include a plurality of intellectual properties (IPs) 110, a temperature management controller 120, and a clock signal generator 130. In addition, the electronic system 100 may further include a display, a communication module, etc. In some example embodiments, the voltage generator 102 may be included in the integrated circuit 101.

One or more of the elements included in the integrated circuit 101, including the plurality of IPs 110, the temperature management controller 120, and the clock signal generator 130 may be implemented by and/or substituted with one or more instances of processing circuitry including hardware including logic circuits; a hardware/software combination including a processor executing software; or a combination thereof. In some example embodiments, the integrated circuit 101 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. that is/are configured to implement the functionality of some or all of the elements of the integrated circuit 101 as shown in FIG. 1 including one or more IPs of the plurality of IPs 110.

Components of the integrated circuit 101 including the plurality of IPs 110, the temperature management controller 120 (also referred to herein as temperature management controller circuitry), and the clock signal generator 130 (also referred to herein as clock signal generator circuitry) may be integrated into one or more semiconductor chips or one or more semiconductor modules. The integrated circuit 101 may be referred to as a system on chip (SoC), an application processor (AP), a mobile AP, or a control chip. In some example embodiments, the voltage generator 102 may also be included in the integrated circuit 101.

The plurality of IPs 110 may include at least two IPs (or an IP block), in some example embodiments, a first IP 111 and a second IP 112. Each IP may include a function block that performs a particular function, and may be implemented by an instance of processing circuitry, including hardware including logic circuits; a hardware/software combination including a processor executing software; or a combination thereof. In some example embodiments, each IP including a function block may be implemented by an instance of processing circuitry that may include, but is not limited to, in some example embodiments, a central processing unit (CPU), a graphics processing unit (GPU), a neural network processor (NPU), a communication processor (CP), each core of a multi-core processor, a power management unit (PMU), a clock management unit (CMU), a system bus, a memory, a universal serial bus (USB), a peripheral component interconnect (PCI), a digital signal processor (DSP), a wired interface, a wireless interface, a controller, embedded software, a codec, a video module (for example, a camera interface), a Joint Photographic Experts Group (JPEG) processor, a video processor, a mixer, a three-dimensional (3D) graphics core, an audio system, a driver, etc. In some example embodiments, an IP that includes a function block that performs a particular function may be referred to interchangeably as an instance of processing circuitry that is configured to implement the IP, including implementing the function block of the IP. In FIG. 1, although the plurality of IPs 110 (also referred to herein as a plurality of IP processing circuitries) are illustrated as including two IPs, this is only for convenience of description, and the plurality of IPs 110 may include three or more IPs.

As shown in at least FIG. 1, each IP of the plurality of IPs 110 may include at least one scan chain. Restated, the plurality of IPs 110 may include a plurality of IP processing circuitries that each include a separate, respective at least one scan chain. In some example embodiments, the first IP 111 and the second IP 112 may include a first scan chain SC1 and a second scan chain SC2, respectively. The first and second scan chains SC1 and SC2 may output test data that indicates an operation status of the IP corresponding to a test mode for testing an operation of the integrated circuit 101 or for collecting debugging data of the integrated circuit 101, in some example embodiments, corresponding to a scan mode.

Referring to FIG. 2, an IP 200 may include a combinational logic 210 (also referred to herein as a combinational logic circuit), a first flip-flop 211, a second flip-flop 213, a third flip-flop 215, and a fourth flip-flop 217, and a first multiplexer 212, a second multiplexer 214, a third multiplexer 216, and a fourth multiplexer 218. A plurality of flip flops (211, 213, 215, and 217), and a plurality of multiplexers (212, 214, 216, and 218) may at least partially comprise a scan chain 220.

The combinational logic 210 may include combinational circuits ("combinational circuitry") including an inverter, an AND gate, an XOR gate, and an OR gate, in which output data is determined by a current data state of input data.

The plurality of flip-flops (211, 213, 215, and 217) may be provided in the IP as a sequential logic circuit, and each of the plurality of flip-flops (211, 213, 215, and 217) may output data applied to an input terminal D via the output terminal Q in response to a clock signal CLK, in other words, in synchronization with a rising edge or a falling edge of the clock signal CLK.

Each of the plurality of multiplexers (212, 214, 216, and 218) may be provided at a front of a corresponding flip-flop of the plurality of flip-flops (211, 213, 215, and 217), and may be provided to the flip-flop that corresponds to an output of the other flip-flop or an output of the combinational logic 210.

In a normal mode in which the IP 200 performs a normal operation, the plurality of flip-flops (211, 213, 215, and 217) may operate as a portion of the sequential logic for implementing an inherent function of the IP. In a normal mode, a non-active level, in some example embodiments, a scan enable signal SE of a logic low may be provided to the plurality of multiplexers (212, 214, 216, and 218), and each of the plurality of multiplexers (212, 214, 216, and 218) may provide the output of the combinational logic 210 (or the input data of the IP) to a corresponding flip-flop in response to the scan enable signal SE, and the output of the plurality of flip-flops (211, 213, 215, and 217) may be provided to the combinational logic 210. Accordingly, the plurality of flip-flops (211, 213, 215, and 217) may operate for the inherent function of the IP.

In a scan mode in which the IP 200 is scan-tested, the plurality of flip-flops (211, 213, 215, and 217) may at least partially comprise the scan chain 220 by being scan-connected, and the scan chain 220 may output test data indicating a state (an operation state or a thermal state) of the IP 200, that is, a scan output SO (also referred to herein as an output pattern) based on a scan input SI (also referred to herein as an input pattern). In the scan mode, the scan enable signal SE of an active level, in some example embodiments, a logic high, may be applied to the plurality of multiplexers (212, 214, 216, and 218), and the plurality of multiplexers (212, 214, 216, and 218) may provide to a corresponding flip-flop the scan input SI or an output of another flip-flop which is not the corresponding flip-flop.

The scan input SI (also referred to as an input pattern) may include a data pattern having a plurality of bits. In response to the clock signal CLK, the plurality of flip-flops (211, 213, 215, and 217) may shift-in the data pattern of the scan input SI to the scan chain 220. Next, when the scan enable signal SE of the non-active level is received during one cycle (in some example embodiments, one cycle of the clock signal CLK), the outputs of the combinational logic 210 based on the data pattern may be captured by the plurality of flip-flops (211, 213, 215, and 217). In some example embodiments, an output of the third flip-flop 215 may be applied to an inverter IV provided in the combinational logic 210, and an output of the inverter IV may be applied to the input terminal D of the fourth flip-flop 217 via the fourth multiplexer 218.

When ("in response to a determination that") the scan enable signal SE of the active level is received again, the plurality of flip-flops (211, 213, 215, 217) may output the scan output SO by shifting-out the captured outputs in response to the clock signal CLK. The scan output SO may be generated based on the scan input SI, and accordingly, the scan output SO may also include a data pattern having a plurality of bits, and the number ("quantity") of bits of the scan output SO may be identical to the number ("quantity") of bits of the scan input SI.

The scan output SO may be predicted from the configuration of the scan input SI and the combinational logic 210. However, when the IP 200 does not operate in a normal manner, in some example embodiments, when a malfunction occurs in combinational circuits of the combinational logic 210 or in the plurality of flip-flops (211, 213, 215, and 217), the scan output SO may include at least one error bit, that is, a bit having data that is different from the data to be predicted.

In a manufacturing operation of the integrated circuit 101 or in a debugging operation of the integrated circuit 101, whether the integrated circuit 101 operates in a normal manner may be tested or debugged, by providing the scan input SI and the scan enable signal SE to the scan chain 220 via the input terminal of the integrated circuit 101 by a test device outside the integrated circuit 101 or the electronic system 100, and by analyzing the scan output SO received via the output terminal, that is, the error bits of the scan output SO.

When the IP 200 is overheated, the scan output SO may include at least one error bit. Although the integrated circuit 101 has been determined as normally operating in the manufacturing or debugging operation described above, when the IP 200 is overheated as the IP 200 is driven at a high speed or by an overdrive voltage, the scan output SO may include at least one error bit. This is explained with reference to FIG. 3.

Figure 3:
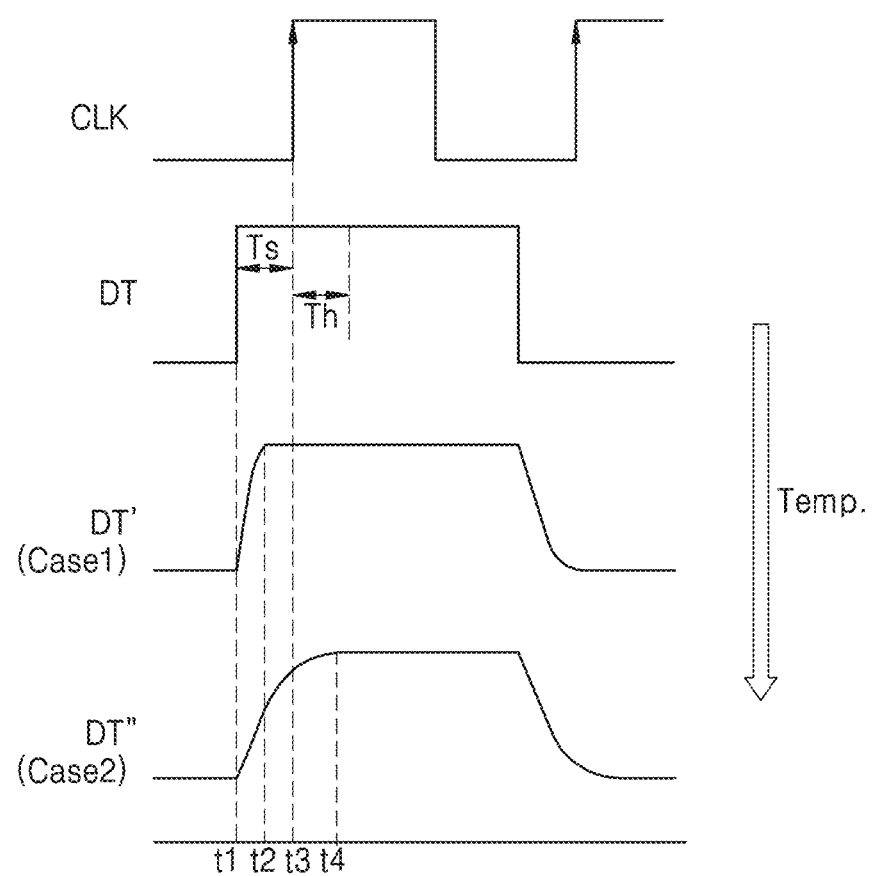
FIG. 3 is a diagram illustrating data bits of a scan output according to the temperature of the IP according to some example embodiments.

FIG. 3 is a diagram illustrating data bits of the scan output SO according to the temperature of the IP according to some example embodiments.

Referring to FIGS. 2 and 3, at the rising edge of the clock signal CLK applied to the scan chain 220, the plurality of flip-flops (211, 213, 215, and 217) may output data applied to the input terminal D via the output terminal Q. Input data DT applied to the input terminal D may be the output data of the combinational logic 210 (for example, the output data of the inverter IV), and for the input data DT to be output through the plurality of flip-flops (211, 213, 215, 217), it may be required that the level of the input data DT is shifted within a setting period Ts before a rising edge occurrence time point t3 of the clock signal CLK, and in addition, the level of the input data DT is maintained during a holding period Th after the rising edge occurrence time point t3.

However, as the temperature of the IP 200 is increased, a transition time period of the level of the input data DT may be increased. Case 1 illustrates a case in which the temperature of the IP 200 is a normal temperature, and Case 2 illustrates a case in which the temperature of the IP 200 exceeds the normal temperature. In the case of Case 1, between a time point t1 and a time point t2, input data DT' may be changed from a low level to a high level. The level of the input data DT' may be shifted before the rising edge occurrence time point t3 of the clock signal CLK, and thus, a flip-flop (one of the plurality of flip-flops 211, 213, 215, and 217) may output a normal data, in some example embodiments, '1'.

However, in the case of Case 2, between the time point t1 and a time point t4, input data DT" may be changed from a low level to a high level. Since a level of the input data DT" is shifted after the rising edge occurrence time point t3 of the clock signal CLK, the flip-flop may output abnormal data, in some example embodiments, '0'.

Accordingly, when the temperature of the IP 200 exceeds the normal temperature, the scan output SO may include at least one error bit, and as the temperature is increased, the number of error bits may be increased. Thus, the temperature of the IP 200 may be detected based on whether an error bit has been generated in the scan output SO, and based on the number of error bits.

Referring to FIG. 1 again, the temperature management controller 120 (also referred to herein as "temperature management controller circuitry") may adjust the temperature of the plurality of IPs 110 by controlling an operation frequency and an operation voltage provided to each of the plurality of IPs 110. The temperature management controller perform a scan test based on using at least one scan chain for at least one IP of the plurality of IPs 110. The temperature management controller 120 may detect the temperature (or the thermal state) of each of the plurality of IPs 110 by ("based on") performing a scan test on the plurality of IPs 110, by using the first and second scan chains SC1 and SC2 provided to the plurality of IPs 110. The temperature management controller 120 may, based on the detected temperature, control at least one of the operation frequency or the operation voltage of each of the plurality of IPs 110 that are a first IP 111 and a second IP 112. The temperature management controller 120 may control a temperature of at least one IP having the at least one scan chain based on which a scan test is performed, based on controlling at least one of an operation frequency or an operation voltage of the at least one IP, based on a result of the scan test.

The temperature management controller 120 may provide the first scan enable signal SE1 of the active level and the first scan input SI1 (i.e., an input pattern, which may include a plurality of bits) to at least a first scan chain SC1 of the first IP 111, and may detect (or determine) a temperature of the first IP 111 based on the first scan output SO1 received from (i.e., an output pattern received from) the first scan chain SC1, where the first scan output SO1 is received from the first scan chain SC1 (e.g., is transmitted from the first IP 111 to the temperature management controller 120) in response to the first scan input SI1 being transmitted to at least the first scan chain SC1. The temperature management controller 120 may determine whether the first IP 111 is at the normal temperature or in an overheated state in which the temperature of the first IP 111 exceeds the normal temperature, based on whether the first scan output SO1 includes at least one error bit. At this time, the error bit may denote a bit, among the plurality of bits of the first scan output SO1, which has data different from data of a corresponding bit among the plurality of bits of the output of the first scan chain SC1 (hereinafter, a first reference output) that is predicted based on the first scan input SI1. For example, the temperature management controller 120 may transmit a scan input (e.g., SI1) and a scan enable signal (e.g., SE1) to at least one scan chain (e.g., SC1) of an IP, compare a scan output received from the at least one scan chain (e.g., SO1) with a reference output (e.g., RO) generated based on the scan input (e.g., SI1), and transmit ("output") a control signal to control one of the operation frequency (e.g., F1) or the operation voltage (e.g., V1) of the IP based on a result of the comparison. The temperature management controller 120 may determine that the IP is in an overheated state, and decrease at least one of the operation frequency or the operation voltage of the IP, in response to a determination that an error bit indicating that a corresponding bit among a plurality of bits of the reference output is different from a corresponding bit among a plurality of bits of the scan output (e.g., SO1) is generated. In some example embodiments, when a third bit of the first scan output SO1 is '0' and a third bit of the second scan output SO2 is '1', the third bit of the first scan output SO1 may be determined as the error bit.

In this manner, the temperature management controller 120 may detect the temperature of the first IP 111 based on the first scan output SO1, and based on the detected temperature of the first IP 111, may control a frequency of the first clock signal CLK1 provided to the first IP 111, that is, the first operation frequency F1 and the first operation voltage V1. It will be understood that such control may include controlling at least one of the first operation frequency F1 or the first operation voltage V1. It will be understood that a frequency of the first clock signal CLK provided to the first IP 111 may be referred to as a frequency of the first IP 111, the first operation frequency F1 may be referred to as an operation frequency of the first IP 111, and the first operation voltage V1 may be referred to as an operation voltage of the first IP 111. When the temperature management controller 120 determines the detected temperature as the normal temperature, in other words, when the first scan output SO1 does not include the error bit, the temperature management controller 120 may maintain the first operation frequency F1 and the first operation voltage V1 the same as before (e.g., identical to prior to the idle state), or increase at least one of the first operation frequency F1 or the first operation voltage V1. When the detected temperature is determined to exceed the normal temperature, that is, when the first scan output SO1 includes at least one error bit, the temperature management controller 120 may decrease at least one of the first operation drive frequency F1 or the first operation voltage V1.

The temperature management controller 120 may adjust the first operation frequency CLK1 and the first operation voltage V1 by supplying a frequency control signal CTRL_F and a voltage control signal CTRL_V for controlling the first operation frequency F1 and the first operation voltage V1 to the first clock signal generator CLK1 and the voltage generator 102, respectively.

Similar to the descriptions above, the temperature management controller 120 may provide to the second scan chain SC2 of the second IP 112 a second scan enable signal SE2 of an active level and a second scan input SI2; detect (or determine) a temperature of the second IP 112 based on the second scan output SO2 received from the second scan chain SC2; and based on the detected temperature, control the frequency of the second clock signal CLK2 provided to the second IP 112, that is, a second operation frequency F2 and a second operation voltage V2.

In some example embodiments, when the first IP 111 and the second IP 112 are in an idle period during operations, the temperature management controller 120 may perform the scan test and adjust the temperature based on a result of the scan test. In some example embodiments, when the first IP 111 and the second IP 112 enter the idle period during operations, the temperature management controller 120 may perform the scan test on the first IP 111 as described above, and based on the result of the scan test, that is, the first scan output SO1, may control at least one of the first operation frequency F1 or the first operation voltage V1, that is, the first scan output SO1.

In some example embodiments, the temperature management controller 120 may determine at least one of the change amounts, that is, a decrease amount of the first operation frequency F1 and/or a change amount of the first operation voltage V1 based on a first error rate. Here, the first error rate may denote the number of error bits over the number of the plurality of bits of the first scan output SO1. It may be determined that the temperature of the first IP 111 becomes higher as the first error rate becomes higher. In some example embodiments, the temperature management controller 120 may decrease the first operation frequency F1 when the first error rate is equal to or less than a first value, and may decrease both the first operation frequency F1 and the first operation voltage V1 when the first error rate exceeds the first value. In some example embodiments, the temperature management controller 120 may increase the decrease amount of the first operation frequency F1 or the decrease amount of the first operation voltage V1, as the first error rate becomes higher.

In some example embodiments, the temperature management controller 120 may determine at least one of the change amounts of the first operation frequency F1 or the change amount of the first operation voltage V1 based on an operation speed characteristic of the integrated circuit 101 or the first IP 111, and the first error rate.

It may be understood by one of ordinary skill in the art that the control method associated with the first IP 111 of the temperature management controller 120 is applicable identically or similarly to the second IP 112 in some example embodiments described above. In this manner, the temperature management controller 120 may detect, in real time, temperatures of the first and second IPs 111 and 112 by using the first and second chains SC1 and SC2 provided in the first and second IPs 111 and 112, respectively, and may adjust the temperatures of the first and second IPs 111 and 112 based on the detected temperatures, respectively.

The clock signal generator 130 may generate a plurality of clock signals, and provide ("transmit") at least one clock signal (e.g., a separate, respective clock signal) to each IP of the first and second IPs 111 and 112. In some example embodiments, the clock signal generator 130 may generate the first clock signal CLK1 and the second clock signal CLK2, and output the first clock signal CLK1 and the second clock signal CLK2 to the first IP 111 and the second IP 112, respectively.

The clock signal generator 130 may control the frequency of the first clock signal CLK1, that is, the first operation frequency F1 and the frequency of the second clock signal CLK2, that is, the second operation frequency F2, based on a frequency control signal CTR_F provided by the temperature management controller 120 and thus in response to receipt of the frequency control signal CTR_F from the temperature management controller 120. The clock signal generator 130 may control a frequency of the first clock signal CLK1 in response to receipt of a frequency control signal CTR_F that is associated with the first IP 111. The clock signal generator 130 may control a frequency of the second clock signal CLK2 in response to receipt of a frequency control signal CTR_F that is associated with the second IP 112. In some example embodiments, when the temperature of the first IP 111 is determined to exceed the normal temperature, the temperature management controller 120 may provide to the clock signal generator 130 the frequency control signal CTR_F indicating to decrease the first operation frequency F1 of the first IP 111, and the clock signal generator 130 may decrease the first operation frequency F1 in response to the frequency control signal CTR_F, and provide the first clock signal CLK1 of the decreased first operation frequency F1 to the first IP 111.

The voltage generator 102 may generate a plurality of operation voltages, and provide ("transmit") at least one operation voltage (e.g., a separate, respective operation voltage) to each IP of the first IP 111 and the second IP 112. The voltage generator 102 may generate the first operation voltage V1 and the second operation voltage V2, and provide the first operation voltage V1 and the second operation voltage V2 to the first IP 111 and the second IP 112, respectively.

The voltage generator 102 may control the first operation voltage V1 and the second operation voltage V2 (e.g., control a magnitude, also referred to as "voltage level", of the first operation voltage V1 and/or the second operation voltage V2) based on the voltage control signal CTR_V provided by the temperature management controller 120 and thus received at the voltage generator 102 from the temperature management controller 120, where the voltage control signal CTR_V may be associated with the first IP 111 and/or the second IP 112. In some example embodiments, when the temperature of the first IP 111 is determined to exceed the normal temperature, the temperature management controller 120 may provide to the voltage generator 102 the voltage control signal CTR_V indicating to decrease a voltage level of the first operation voltage V1 provided to the first IP 111, and the voltage generator 102 may decrease a voltage level of the first operation voltage V1 in response to the voltage control signal CTR_V.

In some example embodiments, the voltage generator 102 may be implemented as a power managed integrity circuit (PMIC) that is separate from the integrated circuit 101 including the plurality of IPs 110. The voltage generator 102 may provide the plurality of IPs 110 with operation voltages including the first operation voltage V1 and the second operation voltage V2 via an input terminal of the integrated circuit 101. However, some example embodiments are not limited thereto, and in some example embodiments, the voltage generator 102 may be provided inside the integrated circuit 101.

As described above, in the integrated circuit 101 of the electronic system 100 according to some example embodiments, the temperature management controller 120 may detect the temperature of each of the plurality of IPs 110 by using the scan chain, and control the temperature of each of the plurality of IPs 110 based on the detected temperature.

The plurality of IPs 110 of the integrated circuit 101 may operate based on a high operation voltage and a high operation frequency to improve the performance. Accordingly, heat may be generated in the plurality of IPs 110. When the temperature of the plurality of IPs 110 rises to a junction limit temperature that exceeds a normal operation range of a semiconductor, defects may be generated in the integrated circuit 101, and the electronic system 100 may malfunction. Accordingly, to reduce or prevent the plurality of IPs 110 from being overheated, the integrated circuit 101 may detect the temperature of the plurality of IPs 110, and may need to control the temperature of the plurality of IPs 110 based on the detected temperature to reduce or prevent the plurality of IPs 110 from being overheated.

In some example embodiments, when the temperature of the plurality of IPs 110 is detected by using a temperature sensor, since the temperature sensor is arranged outside the plurality of IPs 110, the temperature inside the plurality of IPs 110 may not be measured, and since a space for arranging the temperature sensor is required, an area of the integrated circuit 101 may be increased and the power consumption may be increased.

However, as described above, since the integrated circuit 101 according to some example embodiments detects the temperature of each of the plurality of IPs 110 by using the scan chain provided in each of the plurality of IPs 110, a separate temperature sensor may not be required, and the area and the power consumption of the integrated circuit 101 may be decreased. In addition, since the temperature management controller 120 controls, in real time, the temperature of each of the plurality of IPs 110 based on the detected temperature of each of the plurality of IPs 110, the plurality of IPs 110 may maintain a proper level of heating, and thus, the stability of the integrated circuit 101 and the electronic system 100 may be improved.

Figure 4:
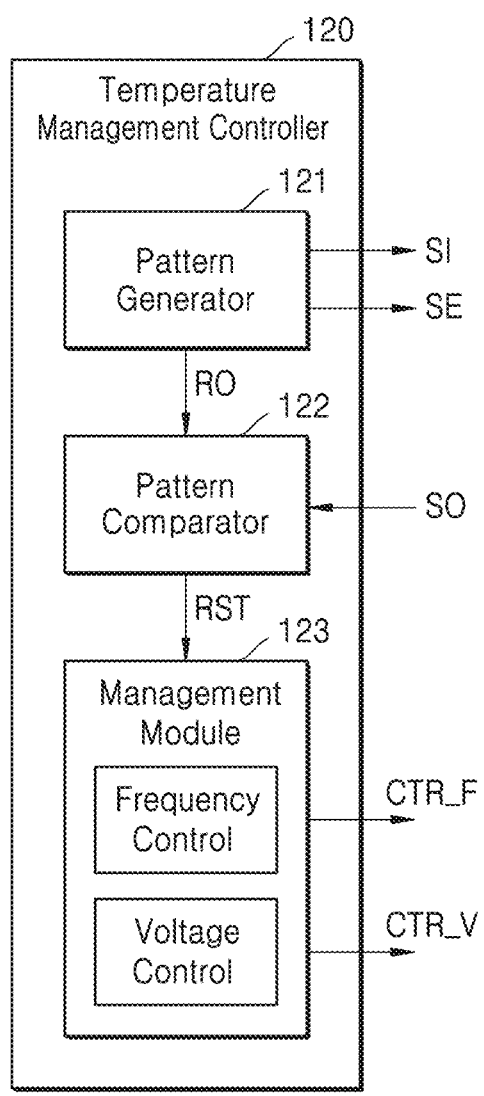
FIG. 4 is a block diagram illustrating an implementation example of a temperature management controller, according to some example embodiments.
Figure 5:
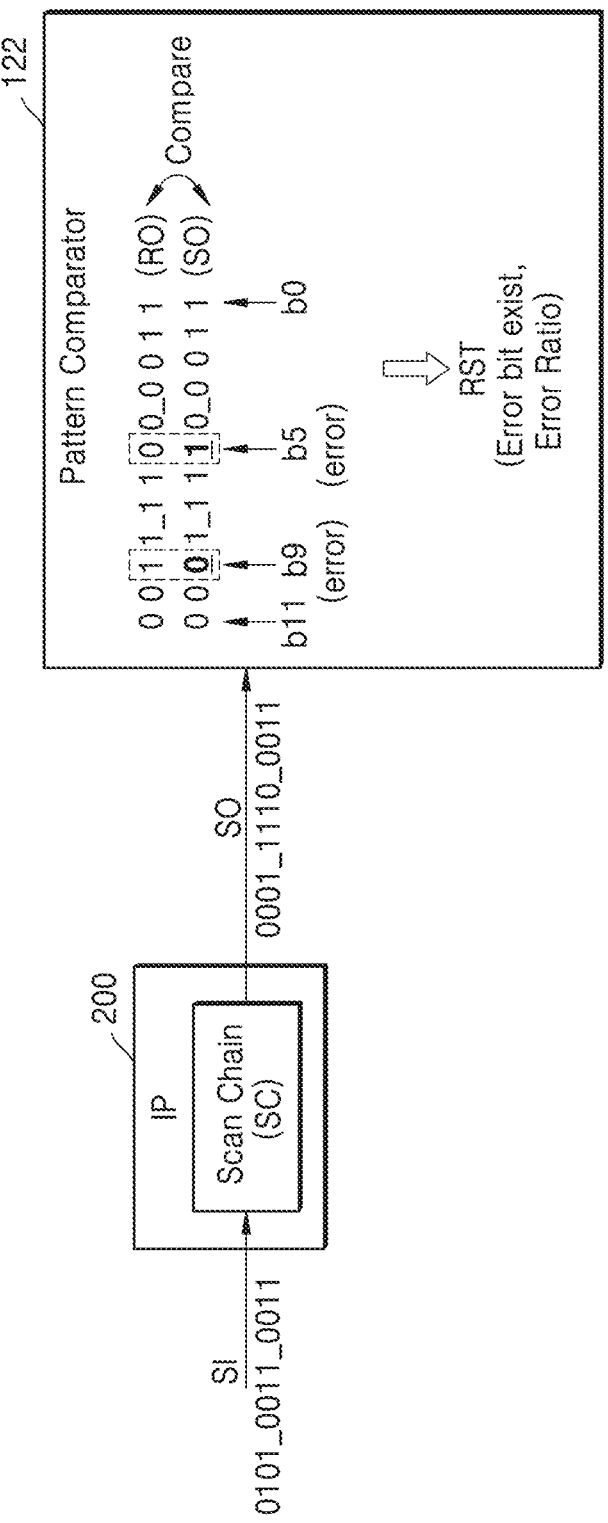
FIG. 5 is a diagram illustrating a pattern comparison method of a pattern comparator in FIG. 4 according to some example embodiments.

FIG. 4 is a block diagram illustrating an implementation of the temperature management controller 120 according to some example embodiments, and FIG. 5 is a diagram illustrating a method of comparing a pattern of a pattern comparator 122 of FIG. 4 according to some example embodiments.

Referring to FIG. 4, the temperature management controller 120 may include a pattern generator 121, the pattern comparator 122, and a management module 123. Some or all of the temperature management controller 120, including the pattern generator 121, the pattern comparator 122, and the management module 123, may be implemented by and/or substituted with one or more instances of processing circuitry including hardware including logic circuits; a hardware/software combination including a processor executing software; or a combination thereof. In some example embodiments, some or all of the temperature management controller 120, including the pattern generator 121, the pattern comparator 122, and/or the management module 123 may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. that is/are configured to implement the functionality of some or all of the elements of the temperature management controller 120 including one or more of the pattern generator 121, the pattern comparator 122, and the management module 123.

The pattern generator 121 may generate the scan input SI including a data pattern (hereinafter, referred to as a pattern) including a plurality of bits, and a scan enable signal SE, and may transfer the scan input SI and the scan enable signal SE to the scan chain of the IP (in some example embodiments, the first IP 111 or the second IP 112 in FIG. 1).

When the IP is at the idle period during operations, the pattern generator 121 may generate a pattern, which is suitable for a circuit configuration of the IP (that is, a combination logic (210 in FIG. 2) a circuit configuration of the scan chain 220), that is, the scan input SI, and the activated scan enable signal SE, and may provide the scan enable signal SE and the scan input SI to the IP. In some example embodiments, the pattern generator 121 may predict an idle period of the IP, that is, a period during which the IP is maintained at the idle period, and may generate the scan input SI based on the predicted idle period. In some example embodiments, the pattern generator 121 may control a length of the pattern of the scan input SI based on the predicted idle period of the IP.

The pattern generator 121 may also generate a reference output RO (a reference output pattern) based on the scan input SI, and provide the reference output RO to the pattern comparator 122. The reference output RO may be an expected pattern of the scan output SO when the temperature of the IP having the scan input SI applied thereto is the normal temperature, and may be generated based on the pattern of the scan input SI and the circuit configuration of the IP.

The pattern comparator 122 may receive the scan output SO received from the scan chain of the IP, and compare the scan output SO with the reference output RO. The pattern comparator 122 may provide to the management module 123 a comparison result RST indicating whether error bits have occurred that show differences between each of a plurality of bits of the reference output RO and each of the plurality of bits of the scan output SO.

Referring to FIG. 5, a pattern of '0101_0011_0011' may be applied as the scan input SI to the scan chain SC of an IP 200, and the pattern of '0001_1100_0011' may be output as the scan output SO. In some example embodiments, the reference output RO that is generated based on the pattern of the scan input SI and the circuit configuration of the IP 200 may include a pattern of '0011_1100_0011'.

The pattern comparator 122 may compare the reference output RO with the scan output SO. That is, the pattern comparator 122 may compare a plurality of bits ("corresponding bits") included in the pattern of the scan output SO (the output pattern received from at least one scan chain, e.g., SO1) with a plurality of bits included in the pattern of the reference output RO ("reference output pattern") that is predicted based on an input pattern provided to the scan chain from which the scan output SO is received (e.g., SI1). As illustrated in FIG. 5, the reference output RO and the scan output SO may include first through twelfth bits b0 through b11, and when sixth bits b5 and tenth bits b9 of the reference output RO and sixth bits b5 and tenth bits b9 of the scan output SO are different from each other, respectively, the sixth bit b5 and the tenth bit b9 of the scan output SO may be detected as the error bits. The comparison result RST may include whether there is the error bit and/or an error ratio. In this case, the error ratio may denote a ratio of the number of error bits over the total number of bits.

Referring to FIG. 4 again, the management module 123 may generate the frequency control signal CTR_F for controlling the operation frequency of the IP, and the voltage control signal CTR_V for controlling the operation voltage of the IP based on the comparison result RST. As described with reference to FIG. 1, the frequency control signal CTR_F may be provided to the clock signal generator (130 in FIG. 1), and the voltage control signal CTR_V may be provided to the voltage generator 102.

When the scan output SO does not include the error bit, the management module 123 may determine that the temperature of the IP is the normal temperature, and may generate the voltage control signal CTR_V and the frequency control signal CTR_F that control the operation voltage and the operation frequency to be maintained, respectively. In some example embodiments, the management module 123 may generate the voltage control signal CTR_V and the frequency control signal CTR_F for increasing at least one of an operation voltage or an operation frequency.

When the scan output SO includes the error bit, the management module 123 may generate the voltage control signal CTR_V and the frequency control signal CTR_F for decreasing at least one of the operation voltage or the operation frequency. In some example embodiments, when the error ratio is equal to or less than a certain reference value, the management module 123 may generate the frequency control signal CTR_F for decreasing the operation frequency, and when the error ratio exceeds the certain reference value, and the management module 123 may generate the voltage control signal CTR_V and the frequency control signal CTR_F for decreasing the operation voltage and the operation frequency.

In some example embodiments, the management module 123 may include an algorithm (or a management table), etc. in which a method, of controlling the operation voltage and the operation frequency based on whether the error bit has been generated, that is, the error ratio, is set, and may generate the voltage control signal CTR_V and the frequency control signal CTR_F based on the algorithm and the comparison result RST.

FIG. 4 illustrates one scan input SI, one scan enable signal SE, one scan output SO, and one comparison result RST for convenience of explanation. However, as described with reference to FIG. 1, since the temperature management controller 120 is capable of individually controlling each of the plurality of IPs 110, a plurality of scan inputs SI, a plurality of scan enable signals SE, a plurality of scan outputs SO, and a plurality of comparison results RST may be transceived to and from the pattern generator 121, the pattern comparator 122, and the management module 123, and each of the pattern generator 121, the pattern comparator 122, and the management module 123 may perform certain functions on the plurality of IPs 110.

The temperature management controller 120 may be implemented as hardware, software, or firmware, or a combination thereof. In some example embodiments, the temperature management controller 120 may be implemented in a hardware logic that performs the certain functions. As another example, the temperature management controller 120 may be implemented as a temperature management program for executing the certain functions and at least one processor for executing the temperature management program. The temperature management program may be stored in a memory provided in the electronic system (100 of FIG.

1) or in the integrated circuit (101 in FIG. 1), and when the integrated circuit 101 operates, the at least one processor may perform the certain functions described above of the temperature management controller 120 by executing the temperature management program.

FIGS. 6A and 6B are diagrams explaining methods of controlling the operation voltage and the operation frequency, according to some example embodiments. The temperature management controller 120 described with reference to FIGS. 1 and 2 may determine change amounts of the operation voltage and the operation frequency.

Referring to FIGS. 2 and 6A, the management module 123 of the temperature management controller 120 may control the operation frequency or the operation voltage based on an error ratio ER of the scan output SO. The temperature management controller 120 may determine, based on an error ratio ER denoting a ratio of a quantity of bits of at least one error bit over a quantity of bits of the plurality of bits of the output pattern (e.g., SO1), at least one of a magnitude of a change (e.g., decrease) of the operation frequency (e.g., the first operation frequency F1) or a magnitude of change (e.g., decrease) of the operation voltage (e.g., the first operation voltage V1). In some example embodiments, the management module 123 may increase the decrease amount of the operation frequency or the operation voltage as the error ratio ER increases. In some example embodiments, the management module 123 may decrease the operation frequency and maintain the operation voltage when ("in response to a determination that") the error ratio ER is equal to or less than a certain reference value (e.g., a first value), in some example embodiments, about 10%, and may decrease the operation frequency and the operation voltage when ("in response to a determination that") the error rate ER is greater than a certain reference value (e.g., the same first value), in some example embodiments, about 10%. In some example embodiments, the temperature management controller 120 may change the operation frequency from a first frequency before the idle state to a second frequency less than the first frequency, in response to a determination that the error ratio ER is equal to or less than a first value, and change the operation frequency from the first frequency to a third frequency less than the second frequency, in response to a determination that the error ratio ER is greater than the first value. In some example embodiments, the temperature management controller 120 may change the operation voltage from a first voltage before the idle state to a second voltage less than the first voltage, in response to a determination that the error ratio ER is equal to or less than a first value, and change the operation voltage from the first voltage to a third voltage less than the second frequency, in response to a determination that the error ratio ER is greater than the first value.

Referring to FIGS. 2 and 6B, the temperature management controller 120 may control the operation frequency or the operation voltage based on an operating speed characteristic SPD and the error ratio ER that are set for the IP or the integrated circuit (101 in FIG. 1).

The integrated circuit 101 or the IP may determine the operating speed characteristic SPD in a manufacturing operation. In some example embodiments, in the manufacturing operation, an operation speed of the integrated circuit 101 or the IP may be tested, and based on a test result thereof, the operation speed characteristic SPD may be set for the integrated circuit 101 or the IP. In some example embodiments, the operating speed characteristic SPD may be set to one of a fast characteristic (FF), a normal characteristic (NN), and a slow characteristic (SS).

Even in the case of identical IP temperature, when the IP includes the FF, a delay time of the IP (in some example embodiments, a transition delay time of data described with reference to FIG. 3) may be less than the delay time in the case of the NN or SS. Accordingly, even when the same error ratio occurs, the temperature of the IP including the FF may be relatively high, and the temperature of the IP including the SS may be relatively low. Thus, the management module 123 of the temperature management controller 120 may control the operation voltage and the operation frequency adaptively to the SPD. The temperature management controller 120 may determine, based on operation speed characteristics (SPD) of the first IP block and the error ratio ER, at least one of a magnitude of change of the operation frequency (e.g., the first operation frequency F1) or a magnitude of change of the operation voltage (e.g., the first operation voltage V1).

In some example embodiments, referring to FIG. 6B, in the case in which the error ratio is about 5% or less, when the SPD is the SS, the operation frequency may be decreased by about 10%; when the SPD is the NN, the operation frequency may be decreased by about 20%; and when the SPD is the FF, the operation frequency may be decreased by about 20% and the operation voltage may be decreased by about 10%. Accordingly, when the error ratio is the same, a temperature decrease amount of the IP of the FF may be greater than the temperature decrease amount of the IP of the SS.

Methods of controlling the operation voltage and the operation frequency have been illustratively described above with reference to FIGS. 6A and 6B, respectively. However, some example embodiments are not limited thereto, and the method of controlling the operation voltage and the operation frequency may be variously set.

Figure 7:
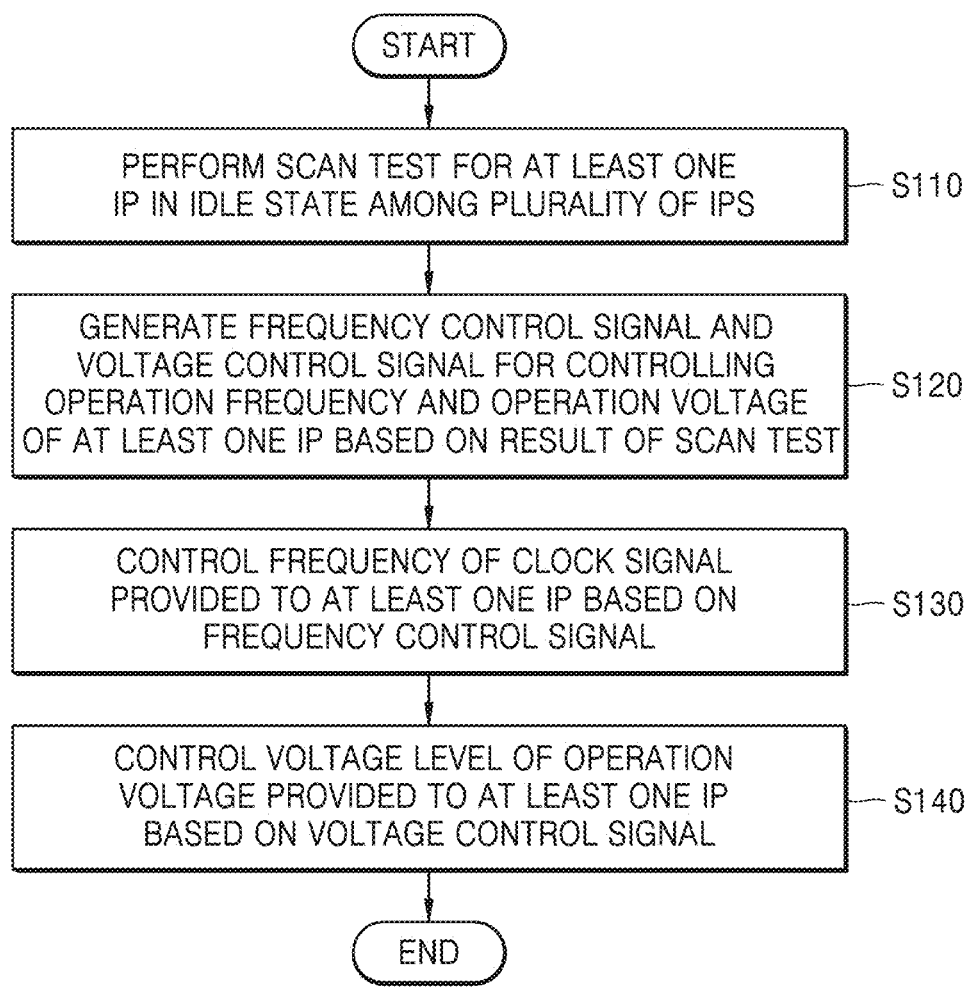
FIG. 7 is a flowchart of an operating method of an integrated circuit, according to some example embodiments.

FIG. 7 is a flowchart of an operating method of the integrated circuit 101, according to some example embodiments. The operating method of FIG. 7 may illustrate a method of adjusting temperatures of a plurality of IPs provided in an integrated circuit, and may be performed in the integrated circuit 101 in FIG. 1. Thus, descriptions of components of an integrated circuit and an operation of the components according to some example embodiments of the inventive concepts described above with reference to FIGS. 1 through 6B may be applied to some example embodiments.

Referring to FIG. 7, the temperature management controller 120 may perform a scan test on at least one IP in an idle period ("idle state") among the plurality of IPs (S110). The at least one IP may be in the idle period during an operation. In some example embodiments, when two or more IPs are in the idle period, the temperature management controller 120 may perform the scan test on each of the IPs based on a scan input that has been set for each of the two or more IPs, and may perform subsequent operations for each of the two or more IPs based on a result of the scan test.

As described with reference to FIG. 1, to perform the scan test at S110, the temperature management controller 120 may provide an activated scan enable signal (a "scan enable signal") and the scan input ("input pattern") to a scan chain included in the IP, and receive a scan output ("output pattern") from the same scan chain. The temperature management controller 120 may compare bits of a data pattern of the scan output (e.g., SO1) with corresponding bits of a data pattern of a reference output. At this time, the reference output ("reference output pattern") may be predicted based on the scan input provided to the IP (e.g., SI1) and a circuit configuration of the IP to which the scan input is applied, and when the IP is at a normal temperature, may include a predicted data pattern of the scan output that is predicted to be output. As a result of the comparison, when an error bit is included in the scan output (e.g., when the bits of the reference output and the bits of the scan output are not identical), the temperature management controller 120 may determine whether the IP is overheated, that is, whether the IP temperature has exceeded the normal temperature. In some example embodiments, the temperature management controller 120 may determine that the first IP 111 is in an overheated stated based on a determination that at least one error bit, indicating a difference in data between the bits of a reference output pattern predicted based on the scan input SI1 with corresponding bits of the scan output SO1 received from scan chain SC1, is generated.

The temperature management controller 120 may generate a frequency control signal and a voltage control signal for controlling ("to control") an operation frequency and an operation voltage of the at least one IP based on the result of the scan test (S120). When the scan output includes the error bit (e.g., in response to a determination that the bits of the reference output are not identical to the corresponding bits of the scan output), the temperature management controller 120 may generate the frequency control signal to decrease the operation frequency and/or generate the voltage control signal to decrease the operation voltage. In some example embodiments, the temperature management controller 120 may control only the operation frequency or only the operation voltage based on an error ratio of the scan output. In some example embodiments, the temperature management controller 120 may generate the frequency control signal for decreasing the operation frequency, and the voltage control signal for maintaining the operation voltage. In some example embodiments, the temperature management controller 120 may decrease at least one of the operation frequency or the operation voltage of the first IP 111 based on the determination that the first IP 111 is in the overheated state. The temperature management controller 120 may determine, based on an error ratio ER denoting a ratio of a quantity of bits of the at least one error bit over a quantity of bits of the plurality of bits of the output pattern (e.g., SO1), at least one of a magnitude of decrease of the operation frequency (e.g., the first operation frequency F1) or a magnitude of decrease of the operation voltage (e.g., the first operation voltage V1).

The clock signal generator 130 may control a frequency of a clock signal provided ("transmitted") to the at least one IP based on the frequency control signal (S130). Thus, the operation frequency of the at least one IP may be controlled. The clock signal generator 130 may increase or decrease, or maintain as before, the frequency of the clock signal provided to the at least one IP based on the frequency control signal.

The voltage generator 102 may control a voltage level of the operation voltage provided to the at least one IP based on the voltage control signal (S140). Thus, the operation voltage, that is, the voltage level, of the at least one IP may be controlled. The voltage generator 102 may increase or decrease, or maintain as before, the voltage level of the operation voltage based on the voltage control signal. In some example embodiments, operation S140 may be performed simultaneously with operation S130.

Figure 8:
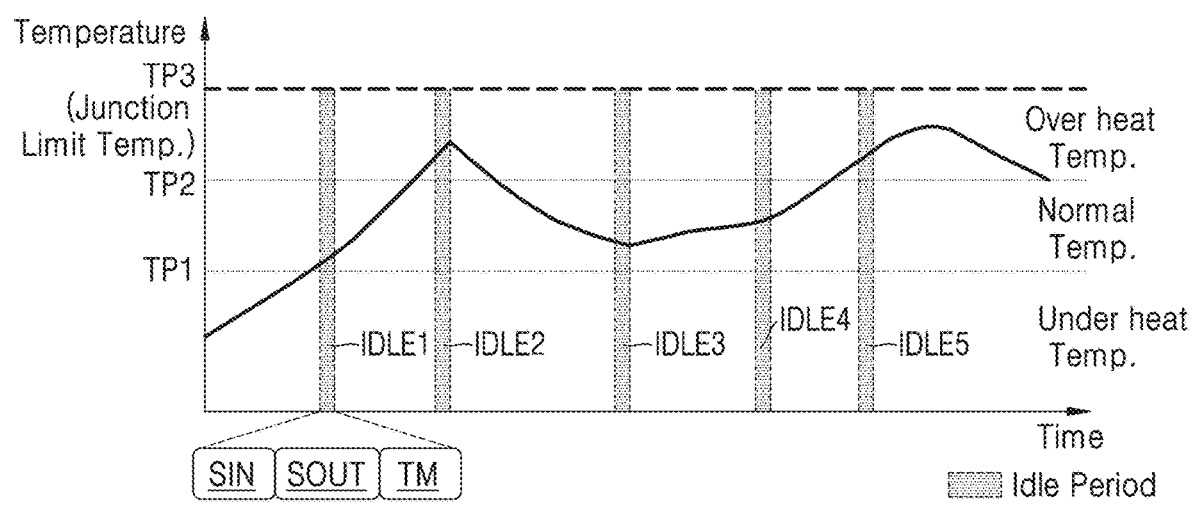
FIG. 8 is a timing diagram illustrating a method of adjusting temperature of the IP provided in an integrated circuit, according to some example embodiments.

FIG. 8 is a timing diagram illustrating a method of adjusting temperature of the IP provided in an integrated circuit, according to some example embodiments.

Referring to FIG. 8, the horizontal axis may denote time, and the vertical axis may denote temperature inside the IP.

The IP may operate based on a certain operation voltage and a certain operation frequency. In some example embodiments, the IP may operate based on a clock signal having the certain operation voltage and the certain operation frequency which are received. As the IP operates, heat may be generated inside the IP, and the temperature inside the IP may be increased.

In some example embodiments, the IP may temporarily be in the idle period during an operation process. In some example embodiments, when the IP includes a communication processor, in some example embodiments, a modem, there may exist a period in which data is temporarily not received (in some example embodiments, a discontinuous reception (DRX)) during a communication process. The IP may be in the idle state during the period in which no data is received. The scan test may be performed on the IP, and the temperature of the IP may be controlled as the operation voltage and the operation frequency of the IP are controlled based on the result of the scan test.

In some example embodiments, the temperature management controller (120 in FIG. 1) may shift in (SIN) the scan input to the scan chain of the IP during the idle period, and thereafter, may receive the scan output that has been shifted out (SOUT) from the scan chain. Next, the temperature management controller (120 in FIG. 1) may control the temperature of the IP based on the scan output (TM). The temperature management controller 120 may determine whether the scan output includes an error bit by comparing the scan output with the reference output. The temperature management controller 120 may adjust the temperature of the IP by controlling the operation frequency and the operation voltage of the IP based on whether the scan output includes the error bit and a ratio of the error bit, that is, the error ratio.

In FIG. 8, since the temperature of the IP in a first idle period IDLE1 is the normal temperature, the scan output may not include an error bit. The temperature management controller 120 may maintain the operation frequency and the operation voltage of the IP as before. In a second idle period, the temperature of the IP may exceed the normal temperature, and the IP may be in an overheated state. The scan output may include an error bit. The temperature management controller 120 may decrease at least one of the operation frequency or the operation voltage of the IP. Accordingly, thereafter, the temperature of the IP may be decreased without being increased to the junction limit temperature. In subsequent idle periods, in some example embodiments, third through fifth idle periods IDLE3 through IDLE5, at least one of the operation voltage or the operation frequency may be decreased, maintained, or increased for controlling the temperature of the IP. In some example embodiments, when the temperature of the IP that is detected in a plurality of subsequent idle periods is the normal temperature, the temperature management controller 120 may determine that the IP is in a low temperature state, and may increase at least one of the operation voltage or the operation frequency.

Figure 9:
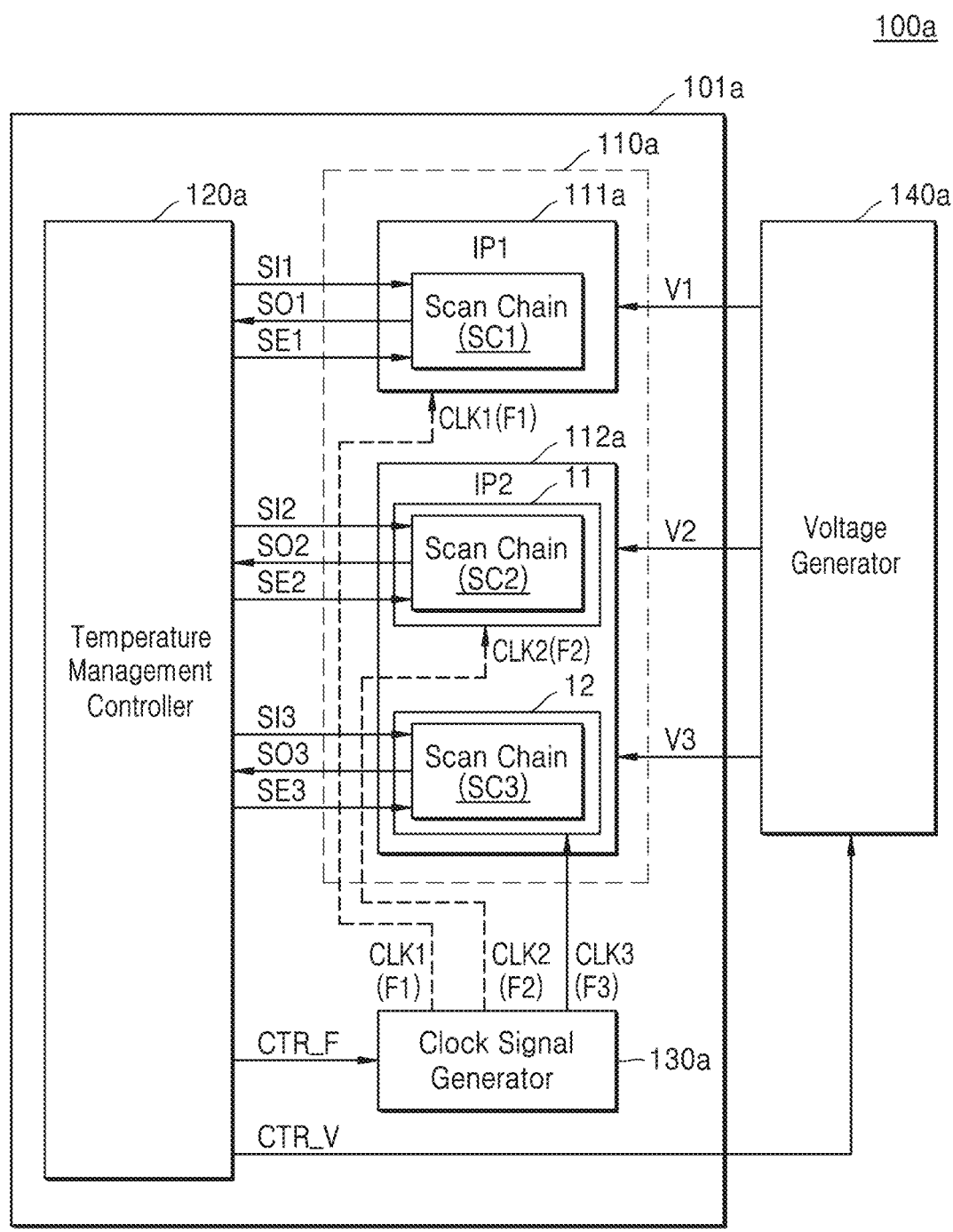
FIG. 9 is a schematic block diagram illustrating an electronic system including an integrated circuit, according to some example embodiments.

FIG. 9 is a schematic block diagram illustrating an electronic system 100a including an integrated circuit 101a, according to some example embodiments.

Referring to FIG. 9, the electronic system 100a may include the integrated circuit 101a and a voltage generator 102a. The integrated circuit 101a may include a plurality of intellectual properties (IPs) 110a, a temperature management controller 120a, and a clock signal generator 130a. A configuration and an operating method of the electronic system 100a of FIG. 9 may be similar to those of the electronic system 100 of FIG. 1. Thus, only differences from the electronic system 100 of FIG. 1 are described.

In some example embodiments, at least one IP among a plurality of IPs 110*a* that include at least a first IP 111*a* and a second IP 112*a*, for example, the second IP 112*a* may include a first core 11 (also referred to herein as first core circuitry) and a second core 12 (also referred to herein as second core circuitry), and operation voltages and operation frequencies of the first and second cores 11 and 12 may be individually controlled, respectively. In some example embodiments, the first core 11 may operate based on the second operation frequency F2 and the second driving voltage V2, and the second core 12 may operate based on a third operation frequency F3 and a third operation voltage V3. In other words, the first and second cores 11 and 12 may be included in different power domains from each other.

It will be understood that each separate core of a given IP (e.g., first core 11 and second core 12 of the second IP 112*a*) may be implemented by and/or substituted with one or more instances of processing circuitry including hardware including logic circuits; a hardware/software combination including a processor executing software; or a combination thereof. In some example embodiments, each core of the first and second cores may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. that is/are configured to implement the functionality of some or all of the elements of the integrated circuit 101 as shown in FIG. 1 including one or more IPs of the plurality of IPs 110.

Each of the first and second cores 11 and 12 may include a scan chain. In some example embodiments, the first core 11 may include the second scan chain SC2, and the second core 12 may include a third scan chain SC3. Accordingly, the scan test may be performed on each of first and second cores 11 and 12.

The temperature management controller 120*a* may perform the scan test on a core in an idle period among the first core 11 and the second core 12, and may adjust the temperature based on the result of the scan test. In some example embodiments, when the first core 11 among the first and second cores 11 and 12 is in an idle period, the temperature management controller 120*a* may perform the scan test on the first core 11, and may respectively control an operation voltage and an operation frequency of the first core 11, that is, the second operation voltage V2 and the second operation frequency F2 for controlling temperature of the first core 11 based on the result of the scan test. It will be understood that, in some example embodiments, the temperature management controller 120*a* may adjust at least one of a first operation frequency or a first operation voltage of the first core 11 (e.g., the second operation frequency F2 and/or the second operation voltage V2 for controlling temperature of the first core 11) based on a first output pattern (e.g., scan output SO2) received at the temperature management controller 120*a* from the first scan chain of the first core (e.g., scan chain SC2). It will be understood that, in some example embodiments, the temperature management controller 120*a* may adjust at least one of a second operation frequency or a second operation voltage of the second core 12 (e.g., the third operation frequency F3 and/or the third operation voltage V3 for controlling temperature of the second core 12) based on a second output pattern (e.g., scan output SO03) received at the temperature management controller 120*a* from the second scan chain of the second core (e.g., scan chain SC3). It will be further understood, in view of at least the above, that the temperature management controller 120*a* may provide ("transmit") an enable signal (e.g., SE2) and a first input pattern (e.g., SI2) to the first scan chain (e.g., SC2), and receive a first output pattern (e.g., SO2) according to the first input pattern (e.g., SI2), in response to a determination that the first core (e.g., first core 11) is in an idle state during an operation. It will be further understood, in view of at least the above, that the temperature management controller 120*a* may provide ("transmit") a separate enable signal (e.g., SE3) and a second input pattern (e.g., SI3) to the second scan chain (e.g., SC3), and receive a second output pattern (e.g., SO03) according to the second input pattern (e.g., SI3), in response to a determination that the second core (e.g., second core 12) is in an idle state during an operation. It will be understand that the enable signals SE2 and SE2 may, in some example embodiments, be the same enable signal ("scan enable signal") or different enable signals.

As described above, in the electronic system 100*a* according to some example embodiments of the inventive concepts, the scan test may be performed for each of a plurality of cores included in the IP as well as the plurality of IPs, and based on the temperature detected according to the result of the scan test, the temperature of each of the plurality of IPs and each of the plurality of cores may be adjusted. Thus, temperature regulation on a level of the integrated circuit 101*a* may be performed more finely than on a level of the core.

Figure 10:
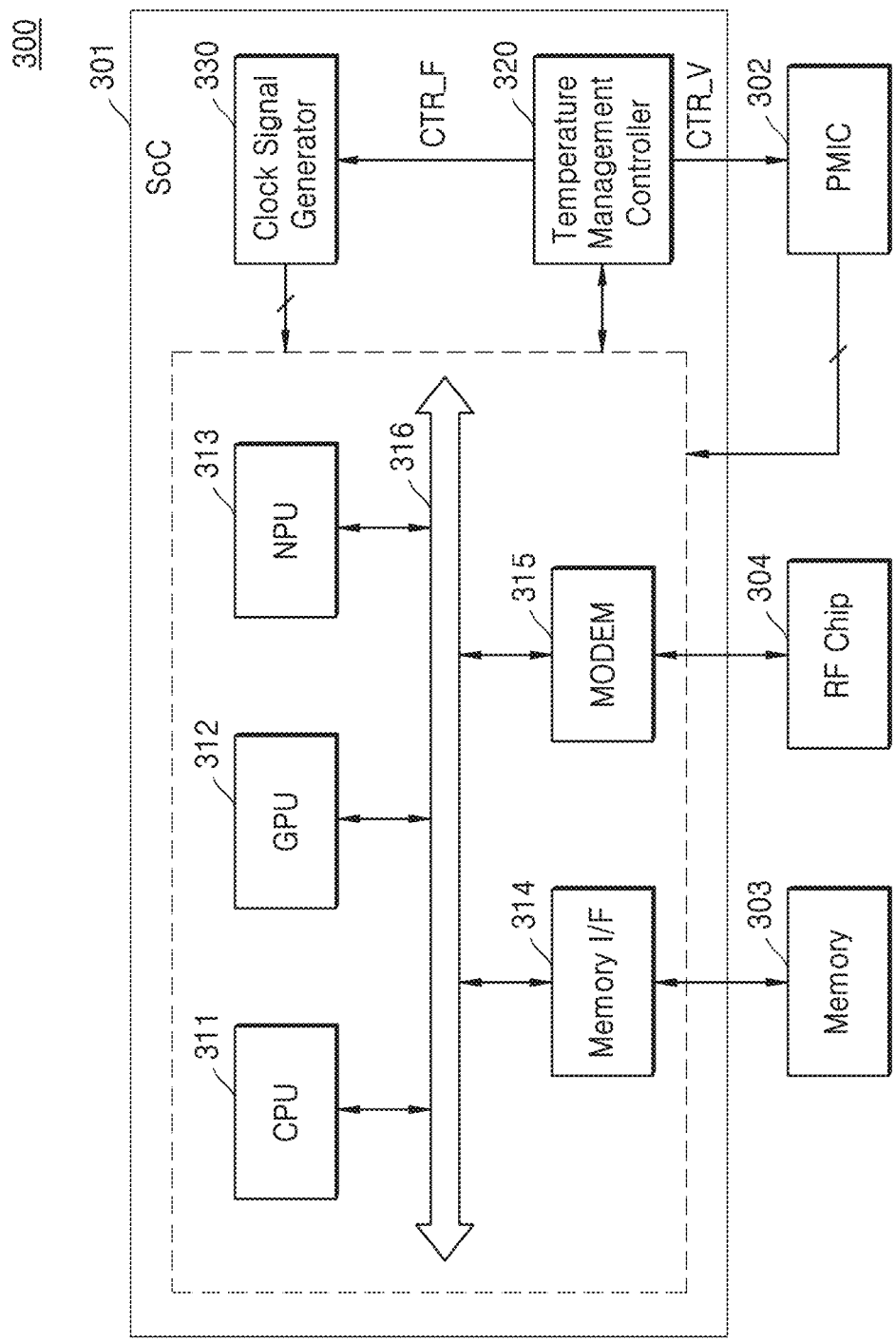
FIG. 10 is a schematic block diagram illustrating an electronic system, according to some example embodiments.

FIG. 10 is a schematic block diagram illustrating an electronic system 300, according to some example embodiments.

Referring to FIG. 10, the electronic system 300 may include an integrated circuit 301, a PMIC 302, a memory 303, and a radio frequency (RF) chip 304. The electronic system 300 may further include various other components. In some example embodiments, when the electronic system 300 includes a portable terminal, the electronic system 300 may further include an image sensor, an antenna, a transceiver, a microphone, a speaker, a touch input unit, various kinds of sensors, etc. The integrated circuit 301 may include a plurality of IPs (311 through 315), a temperature management controller 320, and a clock signal generator 330. The integrated circuit 301 may be implemented as a SoC. The integrated circuit 101 or the integrated circuit 101*a* described with reference to FIGS. 1 through 9 may be applied as the integrated circuit 301 of FIG. 10.

The plurality of IPs (311 through 315) may include data processors including a CPU 311, a GPU 312, an NPU 313, a memory interface 314, and a modem 315, which are communication processors. As shown, the plurality of IPs (311 through 315) may be electrically and/or communicatively coupled together via a bus 316.

The CPU 311 may control operations of the integrated circuit 301 and the electronic system 300 as a whole. In some example embodiments, the CPU 311 may be implemented as a multi-core. The multi-core may include a computing component including two or more independent cores.

The GPU 312 may perform operations related to graphics processing, and the NPU 313 may perform operations related to a neural network. In some example embodiments, the NPU 313 may include an accelerator that processes neural network-based operations.

The memory interface 314 may control an overall operation of a memory 303, and may control data exchange between components of the integrated circuit 301 and the memory 303. The memory interface 314 may write data to the memory 303 or read data from the memory 303 at a request of the CPU 311.

The modem 315 may, for wireless communication, modulate the data to be transmitted to suit a wireless environment, and recover data that has been received. The modem 315 may demodulate the data received from an RF chip 304, and modulate data provided to the RF chip 304.

The RF chip 304 may convert a high frequency signal received via an antenna (not shown) into a low frequency signal, and transmit the converted low frequency signal to the modem 315. In addition, the RF chip 304 may convert the low frequency signal received from the modem 315 into a high frequency signal, and transmit the converted high frequency signal to the outside of the electronic system 300 via an antenna (not shown). In addition, the RF chip 304 may also amplify or filter signals.

Each of the plurality of IPs (311 through 315) may include a scan chain. In addition, at least one IP among the plurality of IPs (311 through 315), in some example embodiments, the CPU 311 may include a plurality of cores, and each of the plurality of cores may include a scan chain.

As described with reference to FIGS. 1 through 9, the temperature management controller 320 may perform the scan test by using a scan chain provided in each of the plurality of IPs (311 through 315) or each of the plurality of cores, detect the temperature based on a result of the scan test, and adjust the temperature of each of the plurality of IPs (311 through 315) or each of the plurality of cores based on the detected temperature. The temperature management controller 320 may generate the voltage control signal CTR_V and the frequency control signal CTR_F for controlling the operation voltage and the operation frequency, provide the frequency control signal CTR_F to the clock signal generator 330, and provide the voltage control signal CTR_V to a PMIC 302.

The clock signal generator 330 may generate a plurality of clock signals, and provide the plurality of clock signals to each of the plurality of IPs (311 through 315) and each of the plurality of cores. The clock signal generator 330 may adjust a frequency of the clock signal based on the frequency control signal CTR_F.

The PMIC 302 may generate a plurality of operation voltages, and provide the plurality of operation voltages to each of the plurality of IPs (311 through 315) and each of the plurality of cores. The PMIC 302 may control a voltage level of the operation voltage based on the voltage control signal CTR_V.

The electronic system 300 according to some example embodiments may detect the temperature of each of the plurality of IPs (311 through 315) or each of the plurality of cores by using the scan chain, and based on the detected temperature, may control the temperature of each of the plurality of IPs (311 through 315) or each of the plurality of cores. Since a separate temperature sensor for temperature detection is not required, the area of the integrated circuit 301 may be reduced, and the power consumption may be reduced. In addition, the temperature of each of the plurality of IPs (311 through 315) or each of the plurality of cores may be detected and controlled, a temperature control of the integrated circuit 301 may be performed precisely.

So far, some example embodiments of the inventive concepts have been described in detail with reference to the accompanying drawings. In some example embodiments, while the detailed description of the inventive concepts has been provided with reference to some example embodiments, various modifications may be made without departing from the scope of the inventive concepts. Therefore, the scope of the inventive concepts should not be construed as being limited to the above-described example embodiments, and may be defined by equivalents to the claims of the inventive concepts as well as the following claims.

What is claimed is:

1. An integrated circuit, comprising:
   intellectual property (IP) processing circuitries, each IP processing circuitry of the IP processing circuitries including a separate, respective at least one scan chain; and
   temperature management controller circuitry configured to
      transmit an input pattern including a plurality of bits to at least one scan chain of a first IP processing circuitry among the IP processing circuitries,
      detect a temperature of the first IP processing circuitry based on an output pattern received from the at least one scan chain of the first IP processing circuitry in response to the input pattern being transmitted to the at least one scan chain of the first IP processing circuitry, and
      control at least one of an operation frequency or an operation voltage of the first IP processing circuitry, based on the detected temperature of the first IP processing circuitry.

2. The integrated circuit of claim 1, wherein
   the first IP processing circuitry includes
      a first core including a first scan chain, and
      a second core including a second scan chain, and
   the temperature management controller circuitry is further configured to
      adjust at least one of a first operation frequency or a first operation voltage of the first core based on a first output pattern received from the first scan chain, and
      adjust at least one of a second operation frequency or a second operation voltage of the second core based on a second output pattern received from the second scan chain.

3. The integrated circuit of claim 2, wherein the temperature management controller circuitry is further configured to
   transmit an enable signal and a first input pattern to the first scan chain, and receive the first output pattern according to the first input pattern, in response to the first core being in an idle state during an operation, and
   transmit a separate enable signal and a second input pattern to the second scan chain, and receive the second output pattern according to the second input pattern, in response to the second core being in an idle state during an operation.

4. The integrated circuit of claim 1, wherein the temperature management controller circuitry is further configured to
   compare a plurality of bits of a reference output pattern predicted based on the input pattern with corresponding bits among a plurality of bits of the output pattern received from the at least one scan chain;
   determine that the first IP processing circuitry is in an overheated state in response to at least one error bit indicating a difference in data between the plurality of bits of the reference output pattern and the corresponding bits among the plurality of bits of the output pattern being generated; and
   decrease at least one of the operation frequency or the operation voltage of the first IP processing circuitry based on the determination that the first IP processing circuitry is in the overheated state.

5. The integrated circuit of claim 4, wherein the temperature management controller circuitry is further configured to
 determine at least one of a magnitude of decrease of the operation frequency or a magnitude of decrease of the operation voltage, based on an error ratio denoting a ratio of a quantity of bits of the at least one error bit over a quantity of bits of the plurality of bits of the output pattern.

6. The integrated circuit of claim 5, wherein the temperature management controller circuitry is further configured to
 decrease the operation frequency in response to a determination that the error ratio is equal to or less than a first value, and
 decrease the operation voltage and the operation frequency in response to a determination that the error ratio is greater than the first value.

7. The integrated circuit of claim 5, wherein the temperature management controller circuitry is further configured to
 determine, based on operation speed characteristics of the first IP processing circuitry and the error ratio, at least one of a magnitude of change of the operation frequency or a magnitude of change of the operation voltage.

8. The integrated circuit of claim 1, further comprising:
 clock signal generator circuitry configured to
 transmit a separate, respective clock signal to each IP processing circuitry of the IP processing circuitries, and
 control a frequency of a first clock signal transmitted to the first IP processing circuitry in response to receipt of a frequency control signal associated with the first IP processing circuitry from the temperature management controller circuitry.

9. The integrated circuit of claim 1, further comprising:
 a voltage generator configured to
 transmit a separate, respective operation voltage to each IP processing circuitry of the IP processing circuitries, and
 control a voltage level of a first operation voltage transmitted to the first IP processing circuitry in response to receipt of a voltage control signal associated with the first IP processing circuitry from the temperature management controller circuitry.

10. The integrated circuit of claim 1, wherein the first IP processing circuitry includes a communication processor.

11. A system on chip, comprising:
 intellectual property (IP) processing circuitries, each IP processing circuitry of the IP processing circuitries including a separate, respective at least one scan chain; and
 temperature management controller circuitry configured to
 perform a scan test based on using at least one scan chain for at least one IP processing circuitry in an idle state among the IP processing circuitries, and
 control a temperature of the at least one IP processing circuitry based on controlling at least one of an operation frequency or an operation voltage of the at least one IP processing circuitry based on a result of the scan test.

12. The system on chip of claim 11, wherein the temperature management controller circuitry is further configured to
 transmit a scan input and a scan enable signal to the at least one scan chain,
 compare a scan output received from the at least one scan chain with a reference output generated based on the scan input, and
 transmit a control signal to control one of the operation frequency or the operation voltage based on a result of the comparison.

13. The system on chip of claim 12, wherein the temperature management controller circuitry is further configured to
 determine that the at least one IP processing circuitry is in an overheated state, and decrease at least one of the operation frequency or the operation voltage, in response to a determination that an error bit indicating that a corresponding bit among a plurality of bits of the reference output is different from a corresponding bit among a plurality of bits of the scan output is generated.

14. The system on chip of claim 13, the temperature management controller circuitry is further configured to, in response to a determination that the error bit is not generated,
 maintain the operation frequency and the operation voltage as identical to prior to the idle state, or
 increase at least one of the operation frequency or the operation voltage.

15. The system on chip of claim 13, the temperature management controller circuitry is further configured to
 determine, based on a ratio of a quantity of error bits over a quantity of bits of the plurality of bits of the scan output, at least one of a magnitude of change of the operation frequency or a magnitude of change of the operation voltage.

16. The system on chip of claim 15, wherein the temperature management controller circuitry is configured to
 change the operation frequency from a first frequency before the idle state to a second frequency less than the first frequency, in response to a determination that the ratio is equal to or less than a first value, and
 change the operation frequency from the first frequency to a third frequency less than the second frequency, in response to a determination that the ratio is greater than the first value.

17. The system on chip of claim 15, wherein the temperature management controller circuitry is configured to
 change the operation voltage from a first voltage before the idle state to a second voltage less than the first voltage, in response to a determination that the ratio is equal to or less than a first value, and
 change the operation voltage from the first voltage to a third voltage less than the second voltage, in response to a determination that the ratio is greater than the first value.

18. An operating method of an integrated circuit including intellectual property (IP) processing circuitries, the method comprising:
 performing, by temperature management controller circuitry, a scan test on at least one IP processing circuitry in an idle state among the IP processing circuitries;
 generating, by the temperature management controller circuitry, a frequency control signal and a voltage control signal to control an operation frequency and an operation voltage of the at least one IP processing circuitry based on a result of the scan test;
 controlling, by clock signal generator circuitry, a frequency of a clock signal transmitted to the at least one IP processing circuitry based on the frequency control signal; and controlling, by a voltage generator, a voltage level of an operation voltage transmitted to the at least one IP processing circuitry based on the voltage control signal.

19. The method of claim 18, wherein the performing of the scan test includes
providing a scan enable signal and an input pattern to a scan chain included in the at least one IP processing circuitry,
receiving an output pattern from the scan chain, and
comparing bits of a reference output pattern with corresponding bits of the output pattern, the reference output pattern being generated based on the input pattern.

20. The method of claim 19, wherein the generating of the frequency control signal includes
generating the frequency control signal to decrease the operation frequency in response to a determination that a plurality of bits of the reference output pattern are not identical to a plurality of bits of the output pattern.

* * * * *